United States Patent
Yoo et al.

(10) Patent No.: US 9,589,772 B2
(45) Date of Patent: Mar. 7, 2017

(54) PLASMA GENERATION SOURCE INCLUDING BELT-TYPE MAGNET AND THIN FILM DEPOSITION SYSTEM USING THIS

(75) Inventors: Suk Jae Yoo, Daejeon (KR); Seong Bong Kim, Daejeon (KR)

(73) Assignee: KOREA BASIC SCIENCE INSTITUTE, Daejeon (KR)

( * ) Notice: Subject to any disclaimer, the term of this patent is extended or adjusted under 35 U.S.C. 154(b) by 143 days.

(21) Appl. No.: 14/124,571

(22) PCT Filed: Jun. 1, 2012

(86) PCT No.: PCT/KR2012/004345
§ 371 (c)(1),
(2), (4) Date: Jan. 3, 2014

(87) PCT Pub. No.: WO2012/169747
PCT Pub. Date: Dec. 13, 2012

(65) Prior Publication Data
US 2014/0124364 A1    May 8, 2014

(30) Foreign Application Priority Data
Jun. 9, 2011   (KR) .................. 10-2011-0055417
May 9, 2012   (KR) .................. 10-2012-0049386

(51) Int. Cl.
C23C 14/35    (2006.01)
H01J 37/32    (2006.01)
(Continued)

(52) U.S. Cl.
CPC ...... *H01J 37/32669* (2013.01); *C23C 14/354* (2013.01); *C23C 14/357* (2013.01);
(Continued)

(58) Field of Classification Search
CPC .................................................. C23C 14/357
See application file for complete search history.

(56) References Cited

U.S. PATENT DOCUMENTS 4,874,497 A * 10/1989 Matsuoka et al. ....... 204/298.16
5,021,114 A *  6/1991 Saito .................... C23C 16/517
                                                      118/723 MA
(Continued)

FOREIGN PATENT DOCUMENTS

EP    0283519 A1    9/1988
EP    0286132 A2   10/1988
(Continued)

OTHER PUBLICATIONS

You H-J et al. "Inclined slot-excited annular electron cyclotron resonance plasma source for hyperthermal neutral beam generation," Review of Science Instruments 82, 013502 (2011).

*Primary Examiner* — Jason M Berman
(74) *Attorney, Agent, or Firm* — Patent Office of Dr. Chung Park

(57) ABSTRACT

The present invention is a plasma generation source and a thing that is in its application and it is for getting high quality thin film by generating even high density plasma in high vacuum and like this plasma generation source applying like this plasma generation source to sputtering system, neutral particle beam source, thin film deposition system combining sputtering system and neutral particle beam source. According to the present invention, it generates plasma by using microwave through the microwave irradiating equipment and magnetic field by more than one pair of the belt type magnets and above goal can be accomplished maximizing plasma confinement effect by inducing electron returning trajectory in accordance with above continuous structure on belt type magnet.

11 Claims, 5 Drawing Sheets

(51) Int. Cl.
  *C23C 14/54* (2006.01)
  *H01J 37/34* (2006.01)
  *H05H 1/46* (2006.01)

(52) U.S. Cl.
  CPC .......... *C23C 14/54* (2013.01); *H01J 37/3266* (2013.01); *H01J 37/32192* (2013.01); *H01J 37/34* (2013.01); *H05H 2001/4607* (2013.01)

(56) References Cited

U.S. PATENT DOCUMENTS

| | | | |
|---|---|---|---|
| 5,022,977 A | | 6/1991 | Matsuoka |
| 5,061,838 A | * | 10/1991 | Lane ................ H01J 37/32357 156/345.42 |
| 5,359,177 A | | 10/1994 | Taki et al. |
| 5,961,773 A | * | 10/1999 | Ichimura ........... H01J 37/32082 118/723 MA |
| 6,027,621 A | * | 2/2000 | Akita .................... C23C 14/352 204/298.06 |
| 2003/0089601 A1 | | 5/2003 | Ding |
| 2004/0121610 A1 | | 6/2004 | Russel |
| 2006/0163466 A1 | * | 7/2006 | Park et al. ..................... 250/251 |

FOREIGN PATENT DOCUMENTS

| | | |
|---|---|---|
| EP | 0477906 A2 | 4/1992 |
| JP | 63-250822 A | 10/1988 |
| TW | 396404 | 10/1998 |
| TW | 200930827 A | 7/2009 |
| WO | 2008/002046 A1 | 1/2008 |
| WO | 2008002089 A1 | 1/2008 |

* cited by examiner

PLASMA GENERATION SOURCE INCLUDING BELT-TYPE MAGNET AND THIN FILM DEPOSITION SYSTEM USING THIS

FIELD OF THE INVENTION

The present invention relates to plasma generation source, morein detail, plasma source generating high density plasma by using permanent magnet array, sputtering system with high efficiency and large area applicability by using it, neutral particle beam source generating high flux and thin film deposition system combining the neutral particle beam source and the sputtering system.

BACKGROUND TECHNOLOGY

Plasma has diverse range of applications, especially, it is an important technology element in the process of forming thin film. High quality thin films deposition is required in the field of advanced material such as semiconductor, OLED, solar cell, LED, diamond thin film etc. and generating large area and high density plasma is the most important technique satisfying this requirement.

Sputtering technology is required for thin film formation offlexible electronic device increasing its use lately, in other words, generating high density plasma through large area and at the same time minimizing thin film damage by high-energy particle and plasma electron during thin film formation applying to flexible display, flexible lighting, flexible solar battery, flexible secondary battery etc. Furthermore, low temperature process technology is required to be available for flexible plastic substrate on low temperature by plasma depositing high quality thin film Conventional magnetron sputtering has been the system integrated with plasma generating power and ion accelerated voltage for resolving plasma generation and acceleration of ion at the same time by applying high voltage that is higher than −500V to the target. Like this, as traditional technology integrated with ion accelerated voltage and plasma generating power on magnetron sputtering applies high voltage to the target, it cannot help generating high energy particles. If target applied voltage is decreased for minimizing the generation of high energy particles, the problem dropping deposition rate greatly will happen because either plasma can be unstable or plasma density can be lower noticeably.

In order to resolve this problem, the technology that controls plasma generating power and ion accelerated voltage each independently by separating them is needed. If plasma generating power and ion accelerated voltage can be applied by separating, it will be possible to realize it in the case of wishing high density plasma generation near the target regardless of target applied voltage level, However the technical development on large area and high density plasma generation source that satisfies such a goal is hard.

However, instead of conventional substrate heating technique, atomic scale heating technique heating thin-film surface atomic layer simultaneously during thin film depositing is needed for depositing high quality thin film on low temperature. Although it is an advantageous technique for depositing large area, high quality thin film on low temperature because neutral particle beam can heat by atom unit, high flux neutral particle beam should be generated for neutral particle beam to work its atom unit heating effect. Conventional neutral particle beam source has plasma limiter between neutralizing reflection plate and substrate, which causes a problem the limiter functions as an obstacle in neutral particle beam reaching the substrate.

For resolving the problem of existing neutral particle beam source, plasma limiter should be removed, high density plasma should be generated for resulting high flux neutral particle beam, and the interaction between plasma and substrate should be minimized, but such technology development is not easy.

Therefore, new sputtering system and high flux neutral particle beam source without plasma limiter is needed for depositing thin film requiring in manufacture field such as flexible electronic device in other words, flexible display, flexible lighting, flexible solar battery, flexible secondary battery etc. Like these systems, once large area, high density plasma source is developed suitable to the goal of new thin film, they can be easily embodied. Therefore, large area, high density plasma source development is the core technology, but it is not provided enough yet.

However, conventionally, for achieving high density plasma in a high-degree vacuum, magnetic field was formed by using permanent magnet or electromagnet and microwave was irradiated so that Electron Cyclotron Resonance (ECR) plasma was generated. But conventional technology got the problem to confine high density plasma that generated in Electron Cyclotron Resonance area on account of the structure on magnetic field. For example, in the case of forming cups field by arranging many permanent magnets leaving an interval of certain space, plasma generated in Electron Cyclotron Resonance area formed in cups field has drift motion such as ExBdrift (E-cross-B drift), magnetic field gradient B drift, magnetic field curvature drift etc. because of the magnetic field and electric field of curve so that the problem about plasma confinement occurs as plasma especially electron gets out to the both ends of magnet with the drift trajectory divergent (open curve). And other example of conventional technology is that plasma drift motion forms discontinuous trajectory so that plasma confinement effect can be decreased because of discontinuous magnetic-field distribution even though the magnet array had been made up in order to resolve plasma confinement problem by forming cups field.

However, in the conventional technology, vacuum can be kept and at the same time microwave can be incident using dielectric window between microwave irradiating equipment and plasma. But deposition process proceeds in this plasma generating source, dielectric window was coated with deposition material so that penetration ratio of microwave dramatically decreases and plasma density can be decreased, so reliability on the process can be weakened.

DETAILED EXPLANATION ABOUT THE INVENTION

Technical Mission

Therefore, the purpose of the present invention is providing plasma generating source which can generate large area, high density plasma through magnet structure that maximizes plasma confinement effect and through associating magnetic-field and microwave.

Moreover, another purpose of the present invention is providing plasma generating source with microwave irradiation unit which can solve the problem of the dielectric window coated during plasma deposition.

Moreover, another purpose of the present invention is providing thin film deposition system combining sputtering system and neutral particle beam source by using above plasma generating source.

Means of Solution on Mission

The present invention can provide plasma generating source comprising plasma chamber which forms plasma generating space;

at least one pair of belt type magnet that surround the outer wall of above plasma chamber; and microwave irradiating equipment that irradiates microwave into the plasma generation space;

the plasma chamber is composed of one of a cylinder type, a cylinder type with elliptical track bottom or polygon column with polygonal bottom, the belt type magnet has continuous magnetic array, the microwave irradiating equipment can irradiate microwave whose electric field can be vertical with magnetic-field direction formed in plasma generating space by belt type magnet to enhance plasma density along magnetic-field distribution.

In addition, the present invention provides plasma generating source which is characterized in that the plasma chamber connects with the microwave irradiating equipment via an opening through which microwave is irradiated and the plasma chamber and microwave irradiating equipment can be vacuumed together.

Also, the present invention provides plasma generating source which is characterized in that the microwave irradiating equipment includes square wave guide, cylinder type wave guide, ring type wave guide, toroidal type wave guide or slit type wave guide with slits formed on the wave guides, and the microwave equipment irradiates microwave in pulse mode or in continuous mode.

Moreover, the present invention provides sputtering system which is characterized in that more than one target can be installed in plasma chamber of the plasma generating source and applied with bias voltage to be sputtered, the more than one target is adhered along the inside wall of plasma chamber to be surrounded by magnetic field forming in plasma generating space according to above belt type magnet, more than one target can be further arranged parallel on the upper side of the plasma chamber, such that more than one material can be deposited on substrate at the same time.

And, the present invention provides sputtering system which is characterized in that bias voltage applied to the target includes D.C. voltage, alternating voltage, pulse or voltage combined with the above voltages.

And, the present invention provides neutral particle beam source which is characterized in that one more neutralizing reflecting plate with high conductivity is installed in plasma chamber of the plasma generating source and neutral particle beam is generated by applying bias voltage to the neutralizing reflecting plates, the neutralizing reflecting plate is adhered along the inside wall of plasma chamber to be surrounded by magnetic field forming in plasma generating space according to above belt type magnet, more than one neutralizing reflecting plate can be further arranged parallel on the upper side of the plasma chamber, such that neutral particle beam is generated.

Besides, the present invention provides neutral particle beam source which is characterized in that neutral particle beam source comprising plasma chamber that provides plasma discharging space generating plasma;

neutralizing reflecting plate installed in the plasma chamber, which changes plasma ion into neutral particle by collision;

limiter installed on the lower place of the plasma discharging space for limiting plasma ion and electron except neutral particle to the plasma discharging space;

microwave irradiating equipment mounted on the plasma chamber to emit microwave into plasma chamber; and one pair of belt type magnet surrounding around the plasma chamber;

the each one pair of belt type magnet shows complementary magnetism polarity between inside and outside of the belt and magnetism polarity of the two belt type magnets arranged above and below in parallel is also in complementary relations from upper to lower sides.

Moreover, the present invention provides thin film deposition system which is characterized by installing more than one the sputtering system and combining more than one the neutral particle beam generating source.

And, the present invention provides thin film deposition system which is characterized in that bias voltage applied to the target or neutralizing reflecting plate includes D.C. voltage, alternating voltage, pulse or voltage combined with the above voltages.

Also, the present invention provides thin film deposition system which is characterized in that the neutralizing reflecting plate is composed of one of metal, silicon or graphite.

Effect of the Invention

According to the present invention, plasma generating source enables high density plasma to be spread uniformly in large area at high vacuum, low operating pressure on account of interaction between magnetic field formed by belt type magnet in plasma chamber and electric field of microwave.

Furthermore, according to the present invention, belt type magnet need not specially to be driven to scan of magnet structure but enable magnetic field to be distributed across large area so that material can be deposited uniformly on large area substrate.

And, according to the present invention, plasma chamber is made of nonmagnetic metal just like stainless steel and not using O-ring for vacuum sealing so that inside of the chamber can be made in high vacuum and mean free path of neutral particle beam that would generate can be improved greatly compared with the case that plasma chamber is composed of quartz or glass etc.

Besides, according to the present invention, sputtering system using the plasma generating source can deposit high quality thin film by separating plasma generating power and ion acceleration voltage to control them independently and minimizing thin film damage by high energy particle. Moreover, it improves sputtering efficiency and feature of straight on the particle that sputtered by generating high density plasma near the target at lower operating pressure. Also according to the present invention, types and numbers of target can be freely chosen to be allowed various processes such as co-deposition.

And, according to the present invention, neutral particle beam generating source that can be made by the target replaced with neutralizing reflecting plate in the sputtering system provides high flux neutral particle beam to large area, especially minimizes plasma-substrate interaction without plasma limiter.

Also, according to the present invention, by combining the sputtering system and the neutral particle beam source more than on, thin film deposition element material and energy necessary for thin film deposition can be provided at the same time and thin film deposition system forming high quality thin film can be embodied.

BRIEF DESCRIPTION OF FIGURES

FIG. 2 is a sectional view that shows more clearly about the composition of microwave irradiating equipment applying to plasma generating source of FIG. 1a.

FIG. 3 is a sectional view that shows more clearly about the construction of toroidal type microwave irradiating equipment applying to plasma generating source of FIG. 1a.

FIG. 4 is a sectional view that shows about the construction of square or cylinder type microwave irradiating equipment applying to plasma generating source of FIG. 1a.

FIG. 5 is a sectional view that shows about the construction of sputtering system using plasma generating source of FIG. 1a.

EXPLANATION OF FIGURE SIGN

Figure 1A:
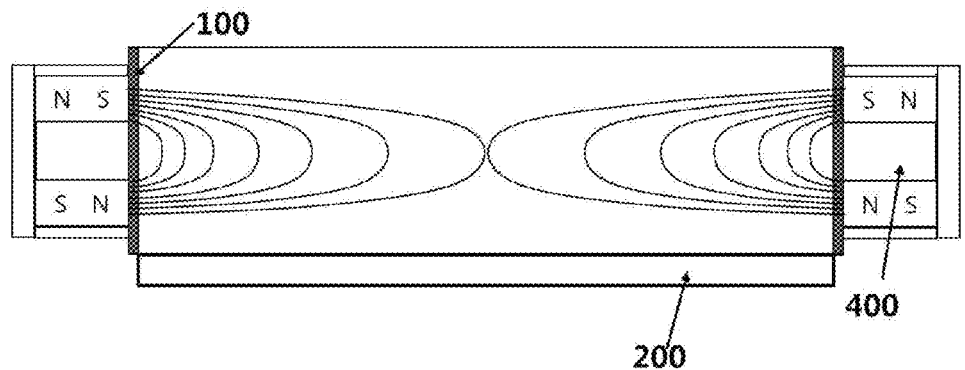
FIG. 1a is a perspective view of plasma generating source structure of the present invention.

100: Plasma chamber
200: Microwave irradiating equipment
250: Slit
300: Neutralizing reflecting plate
400: Belt type magnet
600: Substrate
700,710,720: Target
800: Sputtering system
900: Neutral particle beam source
1000: Thin film deposition system Best Mode of the Present Invention Preferred embodiment of the present invention will be described in detail referred to the attached figures as follow.

By looking FIG. 1a, there is the construction of plasma generation source of the present invention.

More than one pair of belt type magnet(400) is mounted on the side wall of plasma chamber(100) that provides the space generating plasma, microwave irradiating equipment (200) (called launcher) is mounted on the upper side of the plasma chamber(100), microwave emits into plasma chamber(100) from the microwave irradiating equipment (200).

Especially, the present invention, from the microwave irradiating equipment (200), the place where microwave is incident into plasma chamber (100) is composed of complete opening without dielectric window so that it can solve the problem that penetration ratio would drop as contaminating window by deposition material during deposition process.

Figure 1B:
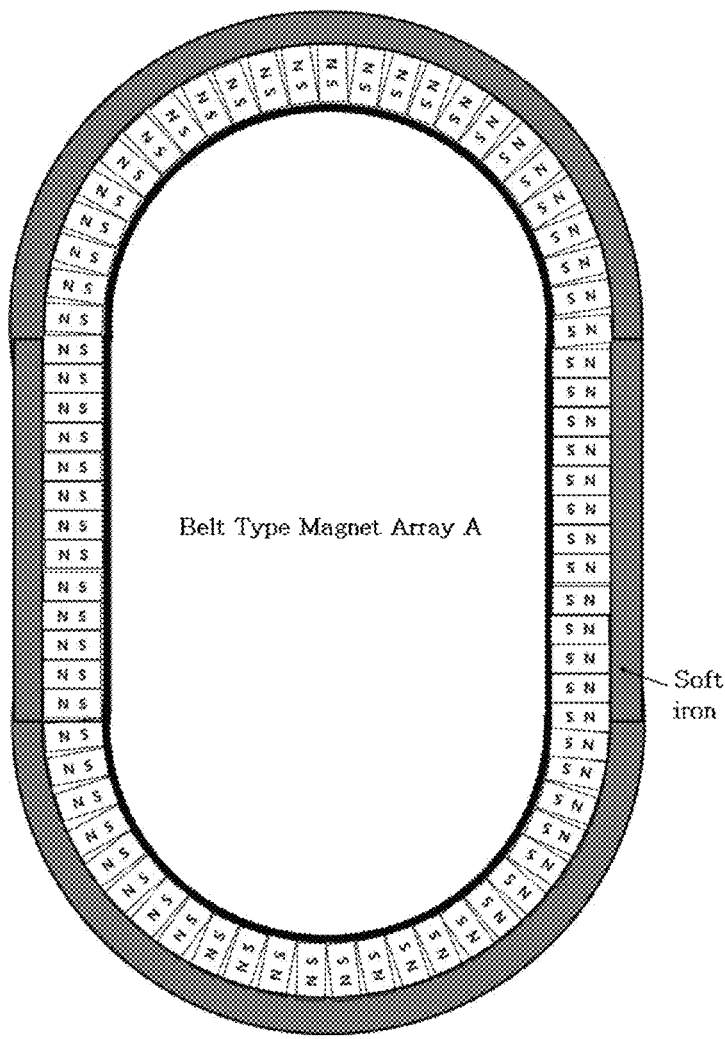
FIG. 1b and FIG. 1c are sectional views of magnet structure composing belt type magnet as a component of plasma generating source and FIG. 1d is a cutting perspective view on plasma generating source of the present invention.
Figure 1C:
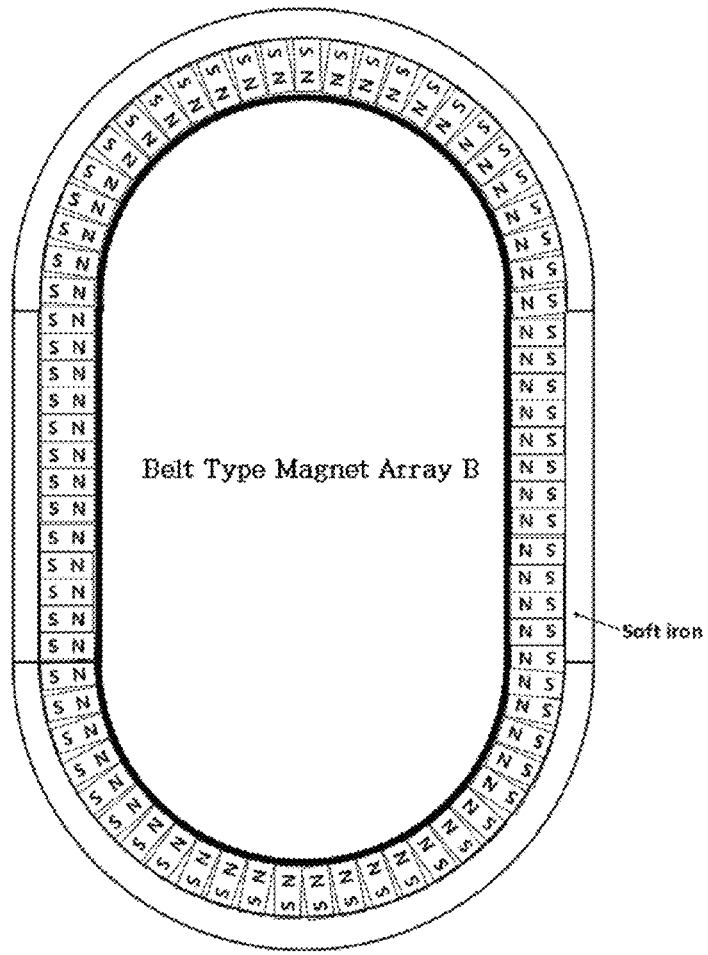

FIG. 1b and FIG. 1c are sectional views about one pair of belt type magnet(400) mounted on outer wall of the plasma generating source on FIG. 1a. It means that A type of belt type magnet (FIG. 1b) and B type of belt type magnet (FIG. 1c) are arranged up and down and magnetic field such as the form of FIG. 1a can be formed. Such this belt type magnet can be arranged not just one pair but many pairs and due to this, inside of plasma generating space, magnetic field same curve line such as FIG. 1a is continuously distributed. Belt type magnet showed on FIG. 1b and FIG. 1c can be, of course, composed of circle type, elliptical track or any closed polygon type. The magnetic field continues without cutting and this is because of the consecutive construction of belt type magnet(400), and like this consecutive construction makes microwave incident through the opening of the top not the side wall of plasma chamber(100). Magnetic field which forms consecutively improves plasma confinement remarkably by collecting electrons of plasma that was generated and making them move on the trace of toroidal type and drift motion continuously along the side wall of plasma chamber. In other words, by looking electronic motion averagely, the consecutive trace of returning is shown like a cutting perspective view of FIG. 1d, so plasma deposition effect greatly can be improved.

Plasma chamber (100) can be a cylinder type, a cylinder type that has circular or elliptical bottom or a faceted cylinder that has polygon bottom, the belt type magnet (400) is mounted on the side wall of plasma chamber(100), which is circle type, track, square or other various shapes depending the structure of plasma chamber(100) and forms Electron Cyclotron Resonance (ECR) magnetic field inside of plasma chamber(100). Electron Cyclotron Resonance (ECR) magnetic field $B_{res}$ is like following formula.

$$B = \frac{2\pi m_3}{e} f$$

f: microwave frequency, e: electron charge, $m_e$: electron mass

Moreover, microwave irradiated from microwave irradiating equipment(200) can be used higher than plasma ion frequency, and plasma ion frequency is like following formula.

$$\Omega_i = \sqrt{4\pi n_i Z^2 e^2 / m_i}$$

$n_i$: ion density, Z: atom number, e: electron charge, $m_i$: ion mass

Like the above plasma generating source can increase plasma density, and magnetic field by more than one pair of belt type magnet(400) mounted to the outer wall and electric field of microwave irradiatied by microwave irradiating equipment (200) are perpendicular to each other, forming ECR(Electron Cyclotron Resonance) plasma, also generate like this high density plasma across large area. In addition, it generates high density plasma in lower pressure high vacuum below 1 mTorr, so it is good to be applied as it increased mean free path of particle.

However, microwave irradiating mode of microwave irradiating equipment (200) generating plasma can be controlled in pulse mode or continuous mode as necessary so that its applicability can be widen.

Embodiment of the Invention

Figure 1D:
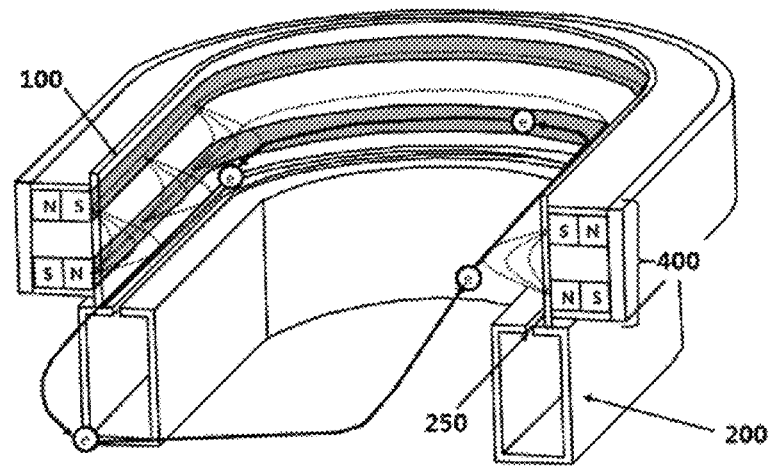
Figure 2:
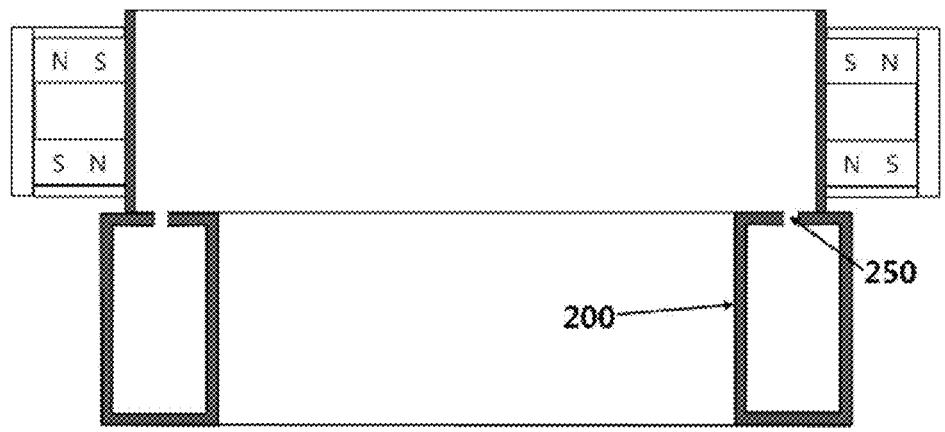
Figure 3:
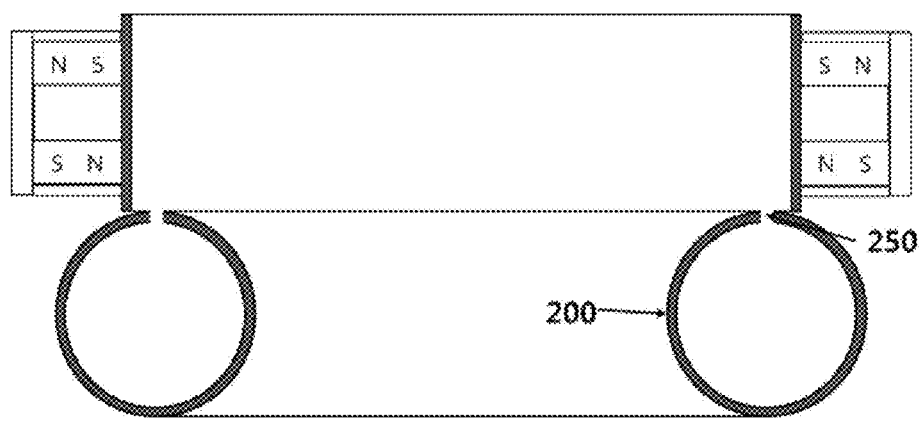
Figure 4:
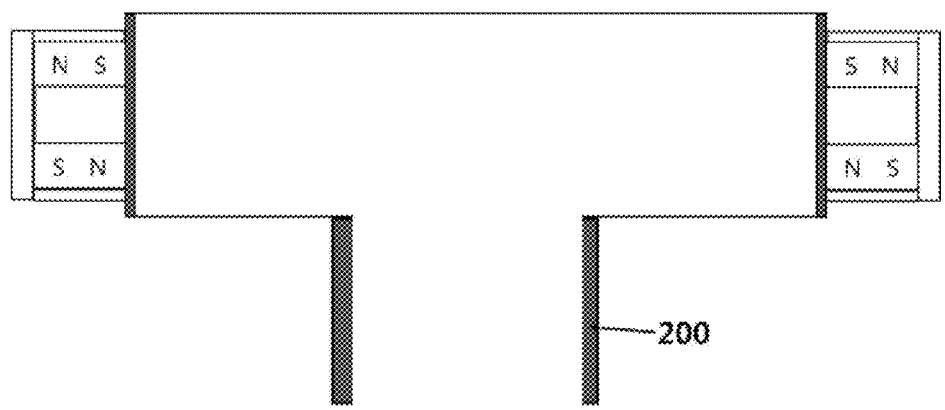

Description about modified embodiment of plasma generating source, sputtering system, neutral particle beam generating source and thin film deposition system due to its application according to FIG. 1a to FIG. 1d in detail below When microwave irradiating equipment (200) of FIG. 1a and FIG. 1d is shown on the top, it looks like circle type, elliptical type, track type or square type by using circle type and elliptical type. FIG. 2 shows that slit (250) is formed on microwave irradiating equipment (200) and FIG. 3 shows that slit is formed on toroidal type microwave irradiating equipment(200). FIG. 4 shows square(rectangular) type or cylinder type microwave irradiating equipment (200). Like this, microwave irradiating equipment (200) can strengthen its emission power by composing plurality.

Figure 5:
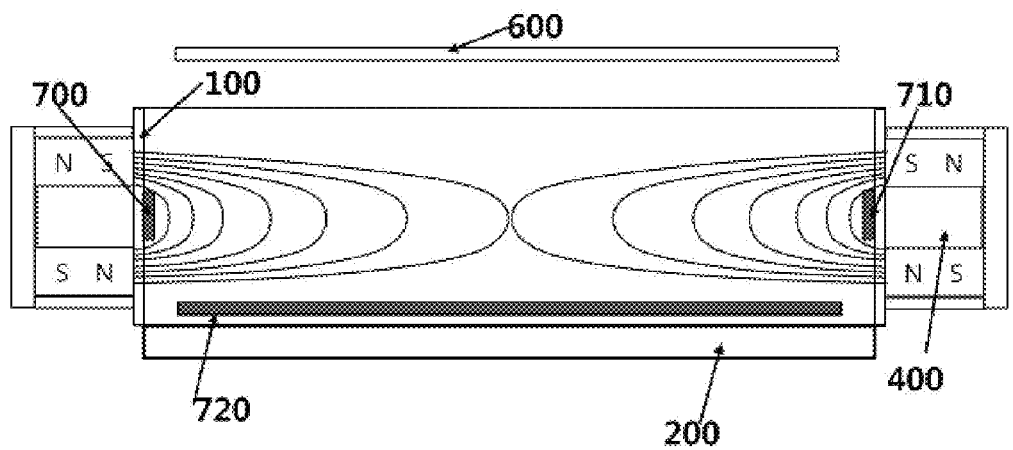

FIG. 5 shows sputtering system (800) that applied above plasma generating source. The sputtering system (800) can generate plasma by heating electron not affecting on plasma ion motion because microwave frequency is higher than plasma ion frequency. Bias voltage of the target (700,710, 720) is applied lower frequency than plasma ion frequency so that it can control ion energy that is incident to the target, which is characterized in separating plasma generating power and ion acceleration voltage. Plasma generating power and ion accelerated voltage is dualized in the sputtering system (800) to maintain high density plasma stably regardless of target applied voltage, whereby it differentiates from conventional sputtering system by which is unstable at lower target applied voltage. Moreover, conventional sputtering system has high target bias voltage so that it damages on thin film by generating high energy particles. On the contrary, the present sputtering equipment (800) can decrease target bias voltage to minimize the problems like the above, which is very advantageous.

On magnetic field near the target (700,710,720) mounted on the side wall of plasma chamber, high density plasma can be generated, so high quality sputtering can be expected.

Besides, high density plasma can be uniformly distributed near target (720) thanks to the magnetic field structure of belt type magnet (400), etching distribution of the target becomes uniform so that it can increase usage efficiency of target (720). Moreover, the target (720) can be composed of large area and it is because that plasma distribution can be formed high density across large area.

However, bias voltage of target (700,710,720) on the present sputtering system (800) can be modified in various way such as D.C. voltage, alternating voltage, D.C. pulse, A.C. pulse or voltage combined with the above voltages depending on needs so that it is possible to control the character of thin film.

And, the target (720) mounted parallel to the upper plate of the chamber and target (700, 710) mounted on the side wall of it are composed of different materials each other, so it is very convenient to be able to co-deposite host material and dopant at the same time.

For instance, Zn from one target (700), $In_2O_3$ from another target (710) and $Ga_2O_3$ from the other target(720) can be formed, so IGZO can be formed on the substrate. On like this arrangement, it can minimize thin film damage at the same time by negative oxygen ion and also it has the merit of increasing deposition rate.

Targets (700,710) mounted on the inner wall of plasma chamber can be composed of a plurality of target pieces to be arranged in radial directions. Target(720) arranged in plasma chamber as the way of horizontal plane can be mounted on upper plate of plasma chamber, or at the center of inside of chamber, and these can also be composed of many pieces. Moreover, targets can be composed of many different materials, but it can be made of same material but adjusted their arrays for high speed, high efficiency, and uniform thin film deposition.

Therefore, the target composition such as large area target etc. is very free, and targets(700,710) mounted on the inner wall of plasma chamber is surrounded by magnetic field from belt type magnet (400) and high density plasma near target can be generated so that it is possible to get high efficiency sputtering.

Also, if plasma chamber (100) is composed of a cylinder type with elliptical tract bottom or a faceted cylinder when a lot of targets (700,710) are installed in inner wall of like this plasma, it has the merits to be convenient to install many targets for reaching the optimum levels of numbers and percentage of components on thin film and to control magnetic field effect by belt type magnet (400) as well.

In addition, sputtering system of this embodiment generates high density plasma at high vacuum and feature of straight on the particle sputtered is improved, and thin film aspect ratio with trench pattern can be improved.

Sputtering system of this embodiment can control plasma generating power and ion accelerated voltage independently, and magnetic field formed by belt type magnet confine plasma charged particle, whereby it can minimize plasma-substrate interaction without extra plasma limiter so that it minimizes thin film damage by plasma. However, plasma limiters can be installed on the boundary of chamber as necessary, which is obvious to ordinary person of the technical field.

Figure 6:
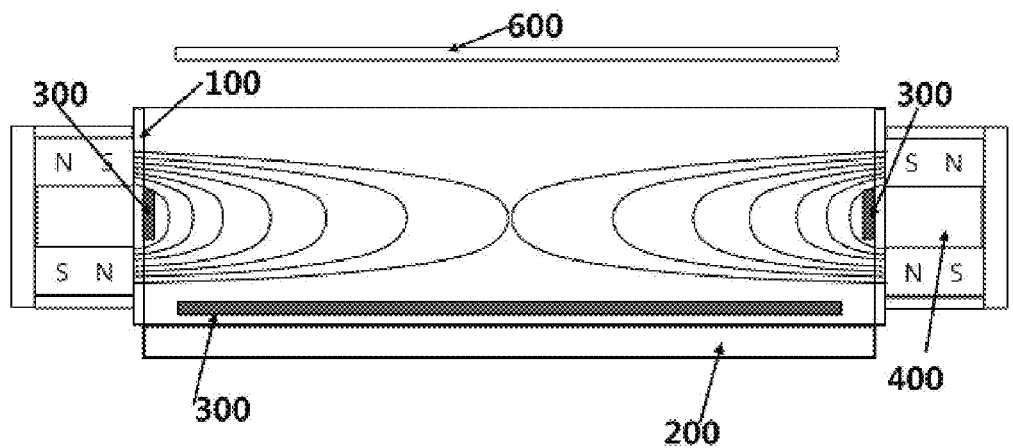
FIG. 6 is a sectional view that shows about neutral particle beam source that transforms sputtering system of FIG. 5.

FIG. 6 shows neutral particle beam source(900) structure modified from the above sputtering system (800).

Targets(700,710,720) of the sputtering system(800) are replaced to neutralizing reflecting plate(300) composed of high conductivity, it will become neutral particle beam generating source(900). If low bias voltage that is lower than −100V is applied to neutralizing reflecting plate(300) composed of high conductivity such as metal like tungsten, silicon or graphite etc., it generates neutral particle beam, and also various mode of bias voltage can be applied as in the above sputtering system in a same way. Neutral particle beam generating source (900) according to this embodiment generates neutral particle beam of high flux on the same principle of above sputtering system (800) generating high density plasma. Neutral particle beam generating source of this embodiment differentiates from conventional neutral particle beam generating source because it minimizes plasma-substrate interaction without plasma limiter. In addition, the advantage by increasing of mean free path shows in a same way with high flux of neutral particle beam on account of generating high density plasma under high vacuum. However, plasma limiters can be installed on the boundary of chamber as necessary, which is obvious to ordinary person of the technical field.

Figure 7:
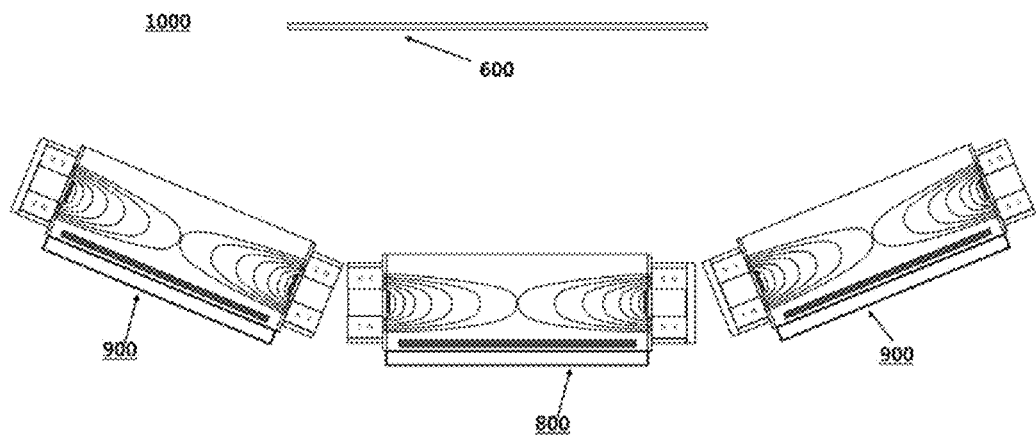
FIG. 7 is a sectional view that shows the example of thin film deposition system consisting with sputtering system of FIG. 5 and neutral particle beam source of FIG. 6.

FIG. 7 shows an embodiment of thin film deposition system (1000) made by combining the above sputtering system (800) and neutral particle beam generating source.

According to above thin film deposition system (1000), it has the merit of forming high quality thin film at low temperature process by providing necessary energy for thin film forming additionally due to neutral particle beam and by providing particle that consists of thin film due to sputtering system (800) at the same time.

In the FIG. 7, thin film deposition system(1000) is embodied by installing two of neutral particle beam generating source(900) one for each at both sides based on one sputtering system(800) at center. However, of course, that combining method can be modified in various different ways by ordinary person of the technical field. For example, one sputtering system (800) and one neutral particle beam generating source(900) can be combined.

Figure 8:
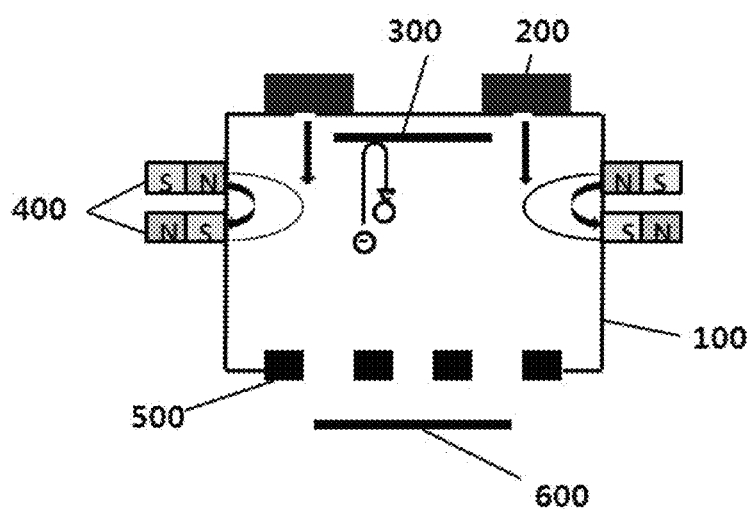
FIG. 8 is an perspective sectional view of neutral particle beam source construction of the present invention including limiter.

FIG. 8 shows the construction neutral particle generating source of the present invention further comprising limiter (500). Even though it minimizes plasma-substrate interaction without limiter, charged particles can be eliminated more completely when neutral particle beam emits from plasma chamber(100) into process chamber that has substrate(600) by further installing limiter(500).

However, belt type magnet(400) can be constructed with not only permanent magnet but also electromagnet which can make microwave frequency increase, so plasma density can be improved.

Right of the present invention does not confine to the examples explained above and organizes by what was written in scope of a request. Besides, it is very true that someone who has common knowledge in the field of the present invention can do various transformations and remake within extent of a right written in scope of a request.

AVAILABILITY INDUSTRIALLY

The present invention can be used widely in the process for forming the thin film using plasma, and it can use plasma generating source and thin film deposition system of the present invention in the field of advanced material especially, LED, solar battery, LED, diamond thin film etc.

What is claimed:

1. A plasma generating source comprising:
   a plasma chamber which forms a plasma generating space;
   first and second belt type magnets that surround an outer wall of the plasma chamber, the second belt type magnet being stacked over the first belt type magnet along the outer wall and arranged parallel to and in a spaced-apart relationship with the first belt type magnet, each of the first and second belt type magnets including a plurality of bar-shaped permanent magnets that each have first and second polarities and are disposed side by side in a belt shape, the plurality of bar-shaped permanent magnets in the first belt type magnet being arranged so that the first polarity of each of the plurality of bar-shaped permanent magnets in the first belt type magnet faces the outer wall of the plasma chamber, the plurality of bar-shaped permanent magnets in the second belt type magnet being arranged so that the second polarity of each of the plurality of bar-shaped permanent magnets in the second belt type magnet faces the outer wall of the plasma chamber, and
   a microwave irradiating equipment that irradiates microwave into the plasma generation space,
   said microwave irradiating equipment including a wave guide that has a toroidal tube and a slit formed along a circumferential direction of the toroidal tube, the toroidal tube being disposed in parallel to an inner rim of the first belt type magnet, wherein microwave is introduced into the plasma chamber through the slit,
   wherein the plasma chamber is in fluid communication with the microwave irradiating equipment via the slit and wherein the plasma chamber and microwave irradiating equipment are configured to be evacuated together.

2. A plasma generating source as recited in claim 1, wherein said plasma chamber is a cylinder type with an elliptical track bottom or a polygon column type with a polygonal bottom.

3. A sputtering system comprising:
   one or more targets installed in the plasma chamber of the plasma generating source in claim 1 and configured to receive a bias voltage during a sputtering process, said one or more targets being adhered to an inside wall of the plasma chamber; and
   additional one or more targets arranged on an upper side of the plasma chamber in parallel to a substrate disposed on a lower portion of said plasma chamber.

4. A sputtering system as recited in claim 3, wherein the bias voltage applied to the target includes D.C. voltage, alternating voltage, pulse or any combination thereof.

5. A neutral particle beam source comprising:
   one or more neutralizing reflecting plates with a high conductivity and installed in the plasma chamber of the plasma generating source of claim 1, wherein a neutral particle beam is generated by applying a bias voltage to the one or more neutralizing reflecting plates, and the one or more neutralizing reflecting plates are adhered to an inside wall of the plasma chamber to be surrounded by the magnetic-field; and
   additional one or more neutralizing reflecting plates arranged parallel to an upper side of said plasma chamber, such that a neutral particle beam is generated.

6. A neutral particle beam source comprising:
   a plasma chamber that provides plasma discharging space;
   a neutralizing reflecting plate installed in the plasma chamber and changes a plasma ion into a neutral particle by collision;
   a limiter installed on a lower portion of the plasma discharging space for limiting a plasma ion and an electron except a neutral particle to the plasma discharging space;
   a microwave irradiating equipment mounted on the plasma chamber to emit microwave into the plasma chamber and including a wave guide that has a toroidal tube and a slit formed along a circumferential direction of the toroidal tube, wherein microwave is introduced into the plasma chamber through the slit;
   first and second belt type magnets that surround an outer wall of the plasma chamber, the second belt type magnet being stacked over the first belt type magnet along the outer wall and arranged parallel to and in a spaced-apart relationship with the first belt type magnet, each of the first and second belt type magnets including a plurality of bar-shaped permanent magnets that each have first and second polarities and are disposed side by side in a belt shape, the plurality of bar-shaped permanent magnets in the first belt type magnet being arranged so that the first polarity of each of the plurality of bar-shaped permanent magnets in the first belt type magnet faces the outer wall of the plasma chamber, the plurality of bar-shaped permanent magnets in the second belt type magnet being arranged so that the second polarity of each of the plurality of bar-shaped permanent magnets in the second belt type magnet faces the outer wall of the plasma chamber; and
   electric fields of the microwave being directed to a center of the plasma chamber to thereby enhance plasma density along a magnetic-field generated by the first and second belt type magnets, wherein the plasma chamber is in fluid communication with the microwave irradiating equipment via the slit and the plasma chamber and microwave irradiating equipment are configured to be evacuated together.

7. A thin film deposition system comprising a plurality of sputtering systems that each are identical to the sputtering system of claim 3.

8. A plasma generating source as recited in claim 1, wherein a cross section of the toroidal tube is a circle, an ellipse or a rectangle.

9. A neutral particle beam source as recited in claim 6, wherein a cross section of the toroidal tube is a circle, an ellipse or a rectangle.

10. A plasma generating source as recited in claim 1, wherein the microwave is introduced directly from the wave guide to the plasma chamber through the slit without using a window between the wave guide and the plasma chamber.

11. A neutral particle beam source as recited in claim 6, wherein the microwave is introduced directly from the wave guide to the plasma chamber through the slit without using a window between the wave guide and the plasma chamber.

\* \* \* \* \*